(12) United States Patent
Wan

(10) Patent No.: US 9,952,260 B2
(45) Date of Patent: Apr. 24, 2018

(54) POWER DETECTION CIRCUIT AND RADIO FREQUENCY CIRCUIT USING THE SAME

(71) Applicant: RichWave Technology Corp., Taipei (TW)

(72) Inventor: Kuang-Lieh Wan, Taipei (TW)

(73) Assignee: RichWave Technology Corp., Taipei (TW)

( * ) Notice: Subject to any disclaimer, the term of this patent is extended or adjusted under 35 U.S.C. 154(b) by 8 days.

(21) Appl. No.: 15/158,614

(22) Filed: May 19, 2016

(65) Prior Publication Data

US 2017/0045559 A1    Feb. 16, 2017

(30) Foreign Application Priority Data

Aug. 11, 2015  (TW) .............................. 104126018 A

(51) Int. Cl.
*G01R 31/00*    (2006.01)
*G01R 21/00*    (2006.01)
*G01R 21/12*    (2006.01)

(52) U.S. Cl.
CPC .............. *G01R 21/00* (2013.01); *G01R 21/12* (2013.01)

(58) Field of Classification Search
CPC ........... G01N 22/00; G01N 2203/0641; G01N 24/008; G01R 31/2822; G01R 33/323; H05H 1/46; Y10S 427/104
See application file for complete search history.

(56) References Cited

U.S. PATENT DOCUMENTS

| 5,610,793 | A  | * | 3/1997  | Luu ........................ | H02H 9/042 |
|  |  |  |  |  | 361/111 |
| 6,313,976 | B1 | * | 11/2001 | Balakrishnan .... | H02M 3/33507 |
|  |  |  |  |  | 361/79 |
| 2011/0193634 | A1 |  | 8/2011  | Ryat |  |
| 2011/0273162 | A1 |  | 11/2011 | Chen |  |

FOREIGN PATENT DOCUMENTS

TW    201310922 A1    3/2013
TW    201522985 A     6/2015

\* cited by examiner

*Primary Examiner* — Tung X Nguyen
(74) *Attorney, Agent, or Firm* — Winston Hsu

(57) ABSTRACT

A power detection circuit includes an input end for receiving an AC input signal, a rectifier for converting the AC input signal into a rectified signal, an output end for outputting the rectified signal, at least two voltage clamp circuits, each for providing an electrical path between the output end and a reference voltage end when the rectified signal is greater than a threshold voltage of the voltage clamp circuit. A threshold voltage of at least one of the voltage clamp circuit is different from a threshold voltage of another clamp circuit.

17 Claims, 5 Drawing Sheets

POWER DETECTION CIRCUIT AND RADIO FREQUENCY CIRCUIT USING THE SAME

CROSS REFERENCE TO RELATED APPLICATION

This application claims the benefit of TW Application No. 104126018 filed on Aug. 11, 2015, the contents of which are incorporated herein.

TECHNICAL FIELD

The present invention relates to a power detection circuit and radio frequency circuit, and more particularly, to a power detection circuit and radio frequency circuit capable of enhancing preciseness of power detection by slope control.

BACKGROUND

Various communication and radar systems operate in Ku bands or higher radio frequency (RF) bands. In these systems, an RF power has to be monitored to immediately compensate a communication condition change, such as an atmospheric pressure change, an interference, a displacement or a direction change. To do so, an RF power detector is employed in an RF power stage to adjust an RF gain or signal level according to a detection result. However, due to circuit limitation, the detection result has a deviation. Therefore, the industry focuses on enhancing preciseness of the detection result.

SUMMARY

One embodiment of the present invention discloses a power detection circuit, comprising an input end, for receiving an AC input signal; a rectifier, for converting the AC input signal into a rectified signal; an output end, electrically coupled to the rectifier, for outputting the rectified signal; and at least two voltage clamp circuits, each electrically coupled between the output end and a reference voltage end, for providing an electrical path between the output end and the reference voltage end when the rectified signal is greater than a threshold voltage of the voltage clamp circuit; wherein a threshold voltage of at least one of the voltage clamp circuit is different from a threshold voltage of another clamp circuit.

Another embodiment of the present invention further discloses a radio frequency circuit, comprising a baseband circuit, for generating a baseband signal according to a rectified signal; a transceiver, electrically coupled to the baseband circuit, for converting the baseband signal into a radio frequency output signal; an amplifier, electrically coupled to the transceiver, for amplifying the radio frequency output signal to generate an AC amplified radio frequency signal; and a power detection circuit, comprising an input end, for receiving the AC amplified radio frequency signal; a rectifier, for converting the AC amplified radio frequency signal into the rectified signal; an output end, electrically coupled to the rectifier, for outputting the rectified signal; and at least two voltage clamp circuits, each electrically coupled between the output end and a reference voltage end, for providing an electrical path between the output end and the reference voltage end when the rectified signal is greater than a threshold voltage of the voltage clamp circuit; wherein a threshold voltage of at least one of the voltage clamp circuit is different from a threshold voltage of another clamp circuit.

DETAILED DESCRIPTION

Figure 1:
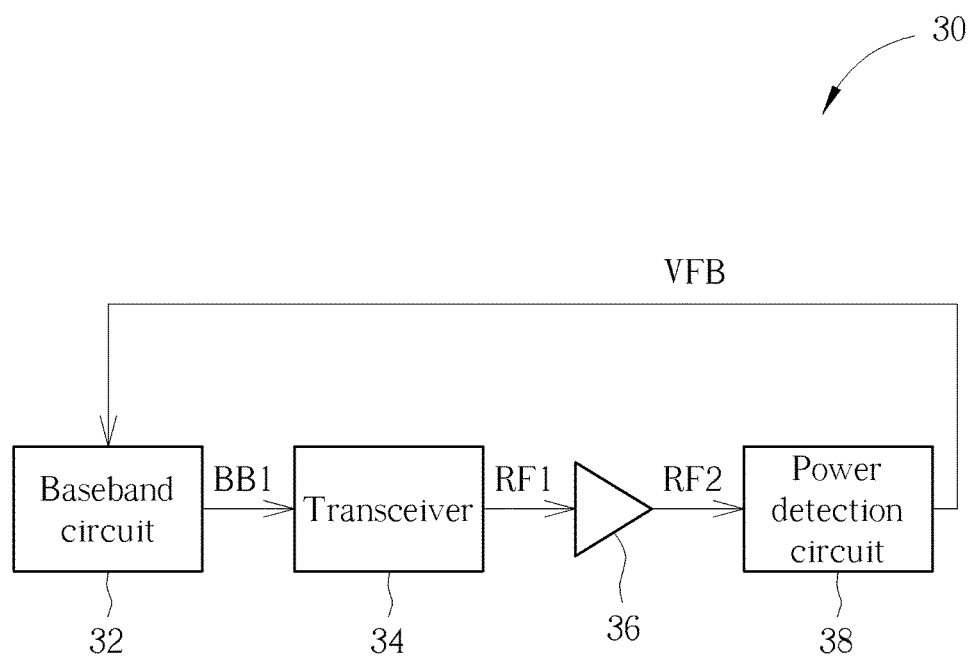
FIG. 1 is a schematic diagram of a radio frequency circuit according to an embodiment of the present invention.

Below, exemplary embodiments will be described in detail with reference to accompanying drawings so as to be easily realized by a person having ordinary knowledge in the art. The inventive concept maybe embodied in various forms without being limited to the exemplary embodiments set forth herein. Descriptions of well-known parts are omitted for clarity, and like reference numerals refer to like elements throughout.

Please refer to FIG. 1, which is a schematic diagram of a radio frequency circuit 30 according to an embodiment of the present invention. The radio frequency circuit 30 includes a baseband circuit 32, a transceiver 34, an amplifier 36 and a power detection circuit 38. The baseband circuit 32 is utilized for generating a baseband signal BB1 according to a feedback signal VFB. The transceiver 34 is utilized for converting the baseband signal BB1 into a first radio frequency signal RF1. The amplifier 36 is utilized for amplifying the first radio frequency signal RF1 to generate a second radio frequency signal RF2. The power detection circuit 38 is utilized for detecting a power of the second radio frequency signal RF2 and generating the feedback signal VFB according to the power, such that the feedback signal VFB is directly proportional to a power $P_{RF2}$ (using dBm as a unit of power) of the second radio frequency signal RF2. Please refer to FIG. 2, which illustrates a curve C1 represents a relationship between the feedback signal VFB and the power $P_{RF2}$, which does not show great linearity and means the feedback signal VFB is not perfectly proportional to the power $P_{RF2}$. In addition, the feedback signal VFB significantly increases at the right side of FIG. 2, which means the feedback signal VFB may exceed a detectable range.

Figure 3:
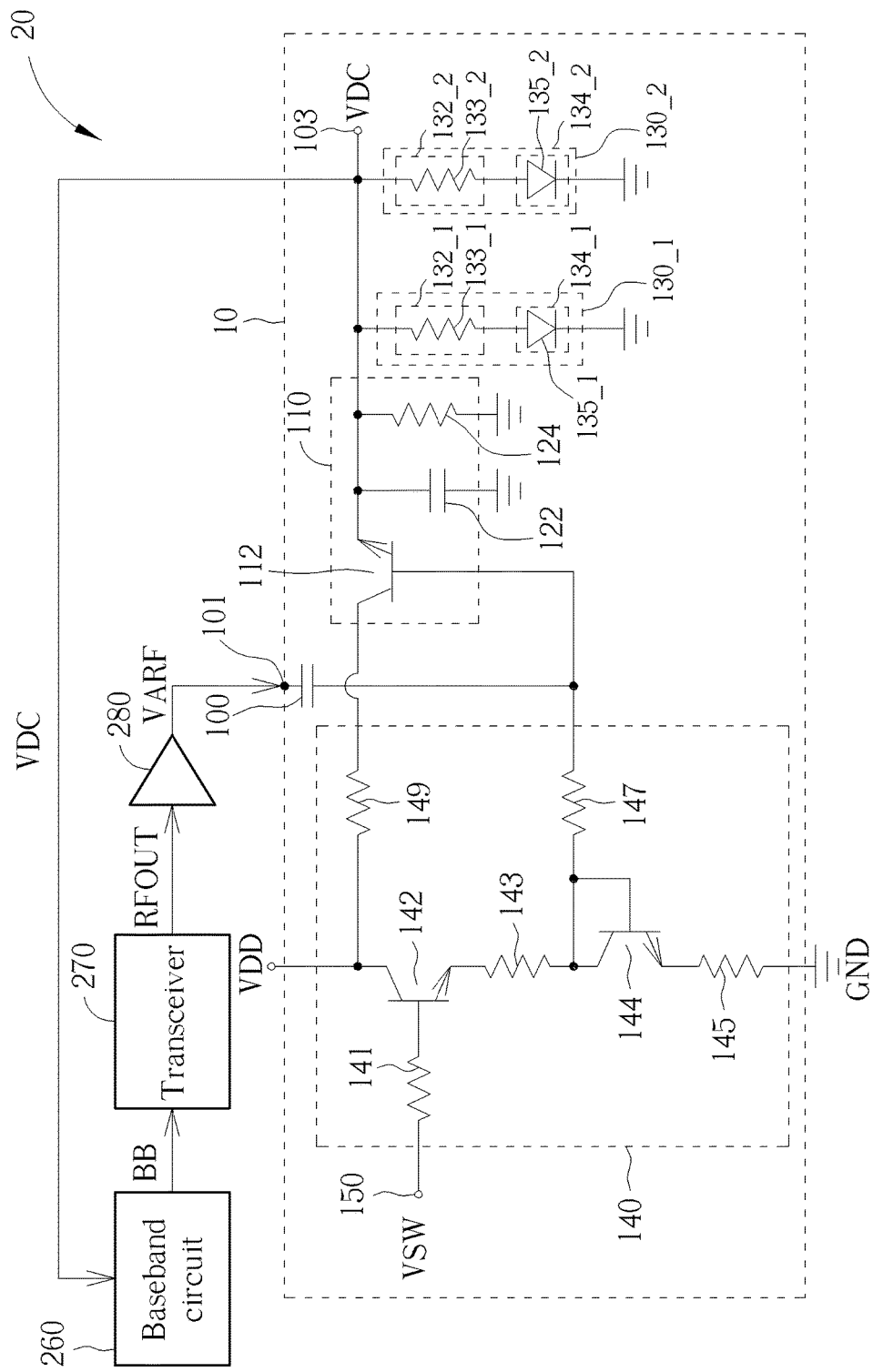
FIG. 3 is a schematic diagram of a radio frequency circuit according to another embodiment of the present invention.

Please refer to FIG. 3, which is a schematic diagram of a radio frequency circuit 20 according to another embodiment of the present invention. The radio frequency circuit 20 includes a baseband circuit 260, a transceiver 270, an amplifier 280 and a power detection circuit 10. The baseband circuit 260 is utilized for generating a baseband signal BB according to a rectified signal VDC. The transceiver 270 is utilized for converting the baseband signal BB into a radio frequency output signal RFOUT. The amplifier 280 is utilized for amplifying the radio frequency output signal RFOUT to generate an AC amplified radio frequency signal VARF. The power detection circuit 10 includes an input end 101, a rectifier 110, an output end 103 and at least two voltage clamp circuits 130_1, 130_2. The input end 101 is utilized for receiving the AC amplified radio frequency signal VARF. The rectifier 110 is utilized for converting the AC amplified radio frequency signal VARF into the DC rectified signal VDC. The output end 103 is utilized for outputting the rectified signal VDC. When the rectified signal VDC is greater than threshold voltages Vth1, Vth2 of the voltage clamp circuits 130_1, 130_2, diodes 135_1, 135_2 are forward biased, such that the voltage clamp circuits 130_1, 130_2 respectively provide equivalent resistors VE1, VE2 between the output end 103 and a reference voltage end GND, i.e. VE1=133_1+conduction resistance of 135_1, VE2=133_2+conduction resistance of 135_2. Note that, a threshold voltage of at least one of the voltage clamp circuit is different from a threshold voltage of another clamp circuit, i.e. the threshold voltages Vth1, Vth2 are different. Therefore, the equivalent resistors VE1, VE2 may be different, or conduction threshold voltages Vdth1, Vdth2 of the diodes 135_1, 135_2 may be different.

Figure 2:
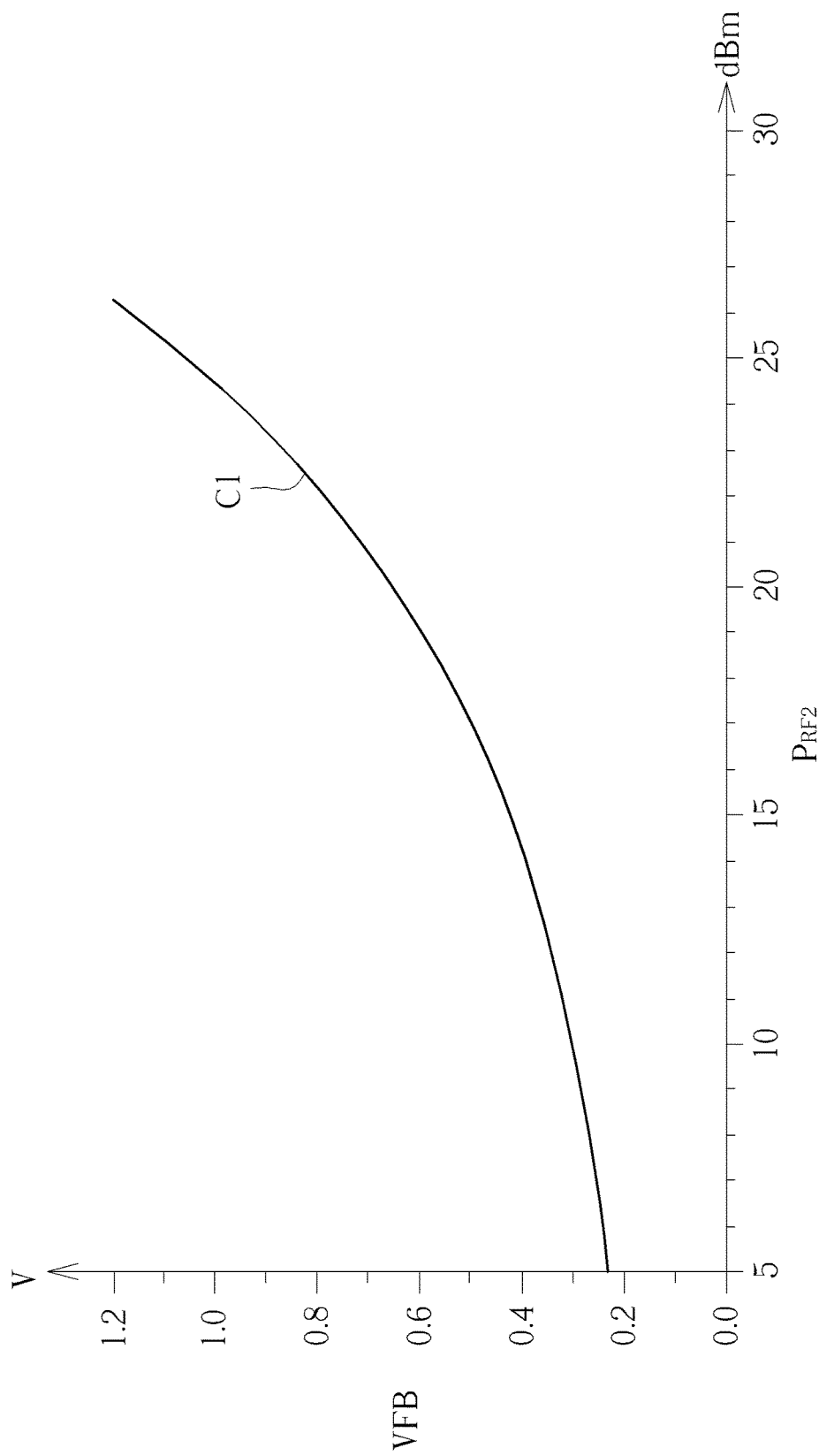
FIG. 2 illustrates a relationship between a feedback signal of the radio frequency circuit of FIG. 1 and a power.
Figure 4:
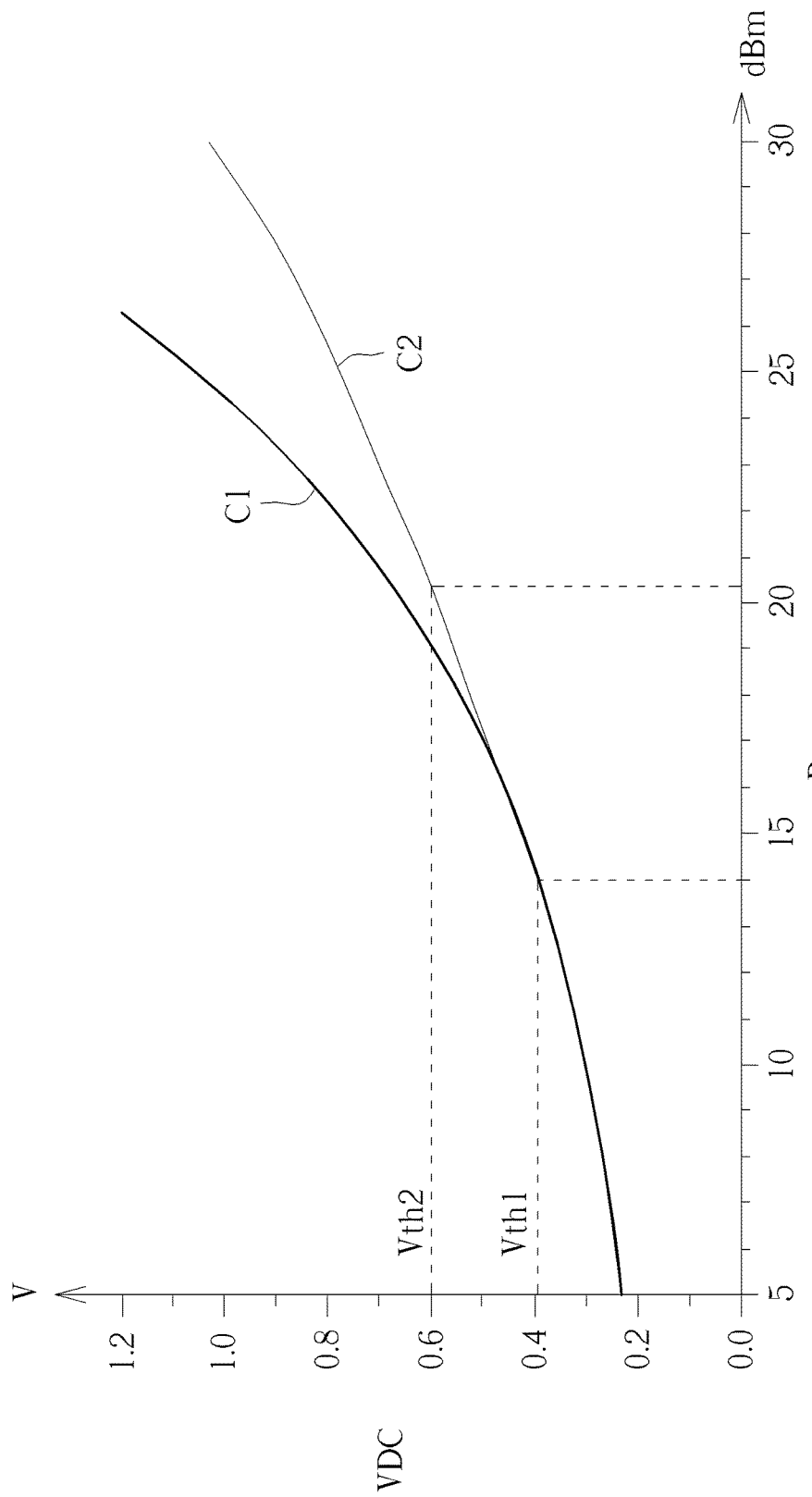
FIG. 4 illustrates a relationship between a rectified signal of the radio frequency circuit of FIG. 3 and a power.

In short, in order to enhance the linearity of the curve C1 of FIG. 2 and guarantee that the feedback signal VFB is detectable, the threshold voltages Vth1, Vth2 could be designed such that a curve C2 of the rectified signal VDC against a power $P_{ARF}$ of the amplified radio frequency signal VARF could approach a straight line approximately, as illustrated in FIG. 4. For example, when the threshold voltage Vth1=0.4 V, the threshold voltage Vth2=0.6 V, and the power $P_{ARF}$=14 dBm, the voltage clamp circuit 130_1 is forward biased, and the voltage clamp circuit 130_2 is reversely biased. When the power $P_{ARF}$=20.5 dBm, both the voltage clamp circuits 130_1, 130_2 are forward biased, such that the curve C2 could approach the straight line more than the curve C1, which means that the rectified signal VDC can be more precisely proportional to the power $P_{ARF}$.

According to an embodiment of the present invention, the voltage clamp circuit 130_1 includes a resistor module 132_1 and a diode module 134_1 which are series connected, and the voltage clamp circuit 130_2 includes a resistor module 132_2 and a diode module 134_2 which are series connected. The resistor modules 132_1, 132_2 respectively include resistors 133_1, 133_2, and the diode modules 134_1, 134_2 respectively include diodes 135_1, 135_2 (or diode connected transistors) with the conduction threshold voltages Vdth1, Vdth2. According to an embodiment of the present invention, resistances of the resistors 133_1, 133_2 are identical, and the conduction threshold voltages Vdth1, Vdth2 of the diodes 135_1, 135_2 are different. According to another embodiment of the present invention, the resistances of the resistors 133_1, 133_2 are different, and the conduction threshold voltages Vdth1, Vdth2 of the diodes 135_1, 135_2 are identical. According to another embodiment of the present invention, the threshold voltages Vth1, Vth2 of the voltage clamp circuits 130_1, 130_2 are variable, e.g. the resistors 133_1, 133_2 are variable resistors capable of tuning voltage clamp.

According to an embodiment of the present invention, the resistor modules 132_1, 132_2 respectively include a first end electrically coupled to the output end 103, a second end, and the resistors 133_1, 133_2 electrically coupled between the first end and the second end. Anodes of the diodes 135_1, 135_2 are electrically coupled to the second end of the resistor modules 132_1, 132_2, and cathodes of the diodes 135_1, 135_2 are electrically coupled to the reference voltage end GND. According to another embodiment of the present invention, positions of the resistor modules and the diode modules can be swapped over. For example, the anodes of the diodes 135_1, 135_2 are electrically coupled to the output end 103. The resistor modules 132_1, 132_2 respectively include a first end electrically coupled to the cathodes of the diodes 135_1, 135_2 and a second end electrically coupled to the reference voltage end GND. The resistors 133_1, 133_2 are electrically coupled between the first end and the second end.

Note that, the voltage clamp circuits 130_1, 130_2 shown in FIG. 3 are a simple case used to introduce some embodiments of the present invention, and can be adjusted and modified by a skilled person in the art based on practical requirements, e.g. more than two voltage clamp circuits can be employed to further enhance the linearity of the rectified signal VDC. According to an embodiment of the present invention, the curve C2 shows great linearity when the equivalent resistor of the voltage clamp circuit 130_2 is 2-10 times the equivalent resistor of the voltage clamp circuit 130_1. Also, the diode modules 134_1, 134_2 may include multiple diodes connected in series to meet the target threshold voltages Vth1, Vth2. According to another embodiment of the present invention, more than two voltage clamp circuits are employed, and have different conduction threshold voltages with each other.

The rectifier 110 may be implemented as a diode. According to an embodiment of the present invention, the rectifier 110 includes a diode-connected first transistor 112, an output capacitor 122 and an output resistor 124 as illustrated in FIG. 3. The output capacitor 122 and the output resistor 124 are connected in parallel and electrically coupled between the output end 103 and the reference voltage end GND. In detail, as shown in FIG. 3, an emitter of the first transistor 112 is electrically coupled to the output end 103, and a base and a collector of the first transistor 112 are indirectly coupled, such that the first transistor 112 can function as a rectifier which converts the AC amplified radio frequency VARF into the DC rectified signal VDC. According to FIG. 4, when the power $P_{ARF}$ is less than 14 dBm, the rectifier 110 solely determines the rectified signal VDC, i.e. the slope of the curve C2 depends only on an equivalent impedance of the output capacitor 122 and the output resistor 124.

Note that, detection of the amplified radio frequency signal VARF would consume electrical energy. In order to timely disable the power detection, the power detection circuit 10 may further include a switch module 140. The switch module 140 is utilized for disabling the first transistor 112 according to a switch voltage VSW. The switch module 140 is driven by a voltage difference between a power voltage VDD and a voltage of the reference voltage end GND. The reference voltage end GND may be a ground end or a constant voltage provider. In the embodiment of FIG. 3, the reference voltage end is the ground end. The switch module 140 includes a power switch end 150, a second transistor 142, a third transistor 144 and bias resistors 141, 143, 145, 147, 149. The second transistor 142 includes a base electrically coupled to the power switch end 150 and utilized for receiving the switch voltage VSW, a collector electrically coupled to the collector of the first transistor 112 and utilized for receiving the power voltage VDD, and an emitter electrically coupled to the base of the first transistor 112. The third transistor 144 includes a collector electrically coupled to the emitter of the second transistor 142, a base electrically coupled to the collector, and an emitter electrically coupled to the reference voltage end GND. The first bias resistor 141 is electrically coupled between the power switch end 150 and the base of the second transistor 142. The second bias resistor 143 is electrically coupled between the emitter of the second transistor 142 and the collector of the third transistor 144. The third bias resistor 145 is electrically coupled between the emitter of the third transistor 144 and the reference voltage end GND. The fourth bias resistor 147 is electrically coupled between the collector of the third transistor 144 and the base of the first transistor 112. The fifth resistor 149 is electrically coupled between the collector of the first transistor 112 and the collector of the second transistor 142.

In detail, as illustrated in FIG. 3, the base and collector of second transistor 142 respectively receive the switch voltage VSW and the power voltage VDD. For example, the switch voltage VSW is designed to be 3 V when representing logic "1" or to be 0 V when representing logic "1", and the power voltage VDD is designed to be 3.3 V. In such a configuration, when the switch voltage VSW is 3 V, the second transistor 142 is enabled, and the collector and the base of the first transistor 112 are electrically connected, such that the first transistor 112 can function as a rectifier, so as to activate the power detection circuit 10. On the contrary, when the switch voltage VSW is 0 V, the second transistor 142 is disabled, such that the first transistor 112 can no longer function as the rectifier, and there is no electrical path between the power voltage VDD and the reference voltage end GND, so as to switch off the power detection circuit 10.

According to the above operations and FIG. 4, when the power $P_{ARF}$ is less than 14 dBm, the rectifier 110 solely determines the slope of the curve C2. When 20.5 dBm>$P_{ARF}$>14 dBm, the rectifier 110 and the voltage clamp circuit 130_1 together determine the slope of the curve C2, which can suppress the increase trend of the rectified signal VDC. when the power $P_{ARF}$ is greater than 20.5 dBm, all the rectifier 110 and the voltage clamp circuits 130_1, 130_2 determine the slope of the curve C2 to further suppress the increase trend of the rectified signal VDC. In other words, the threshold voltages Vth1, Vth2 of the voltage clamp circuits 130_1, 130_2 can determine the two turning points of the curve C2, and the equivalent resistors VE1, VE2 of the voltage clamp circuits 130_1, 130_2 can determine the slope of the curve C2 after the two turning points. That is, a skilled person in the art can modify the threshold voltages Vth1, Vth2 and the equivalent resistors VE1, VE2 to bend the curve C2 to approach a straight line, or can add more voltage clamp circuits to include more turning points and slope control. As a result, the rectified signal VDC can be more linearly proportional to the power $P_{ARF}$.

According to another embodiment, the power detection circuit 10 further includes an input capacitor 100 electrically coupled between the input end 101 and the rectifier 110 and utilized for coupling the amplified radio frequency signal VARF.

Figure 5:
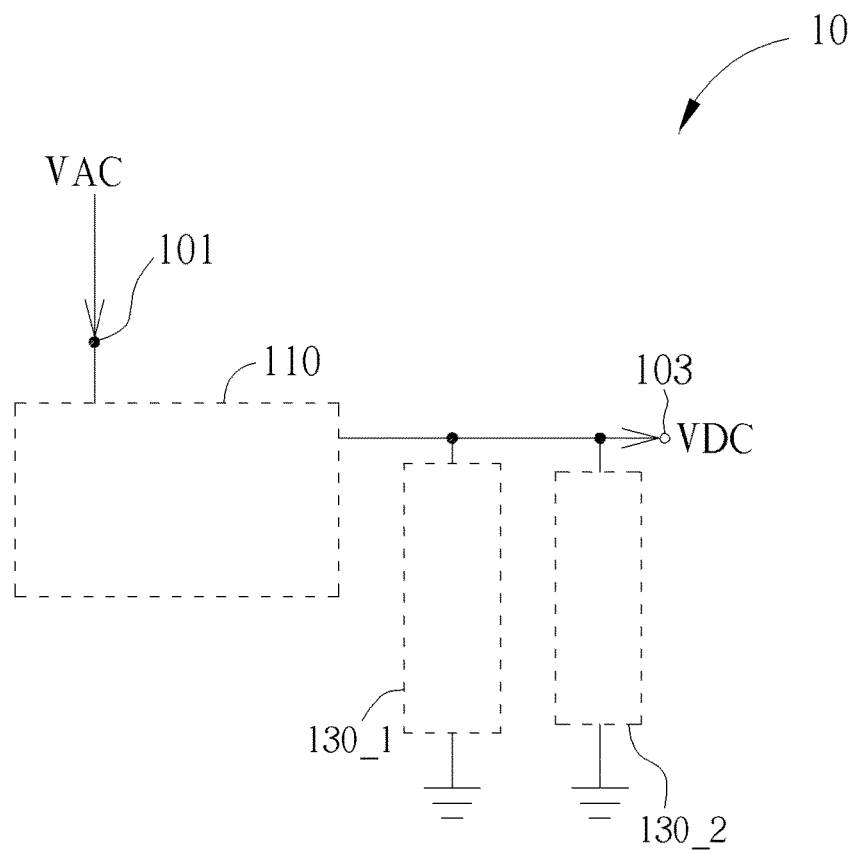
FIG. 5 is a schematic diagram of a power detection circuit according to an embodiment of the present invention.

Note that, the power detection circuit 10 shown in FIG. 3 can be regarded as an independent component, as illustrated in FIG. 5. The power detection circuit 10 includes the input end 101, the rectifier 110, the output end 103 and the at least two voltage clamp circuits 130_1, 130_2. The input end 101 is utilized for receiving an AC signal VAC. The rectifier 110 is utilized for converting the AC signal VAC into the rectified signal VDC. The output end is utilized for outputting the rectified signal VDC. When the rectified signal VDC is greater than both of the threshold voltages Vth1, Vth2 of the voltage clamp circuits 130_1, 130_2, the voltage clamp circuits 130_1, 130_2 provide electrical paths to a ground while the threshold voltages Vth1, Vth2 are different. Base on practical requirements, a skilled person in the art can employ the power detection circuit 10 in applications other than the radio frequency circuit 20. Details of the power detection circuit 10 are described in the above and are not further narrated herein again.

To sum up, by employing at least two voltage clamp circuits, the embodiments of the present invention could control the slope of the relationship curve between the rectified feedback signal and the power of the input radio frequency signal, such that the relationship curve could approach a straight line approximately, which means that preciseness of the power detection circuit could be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A power detection circuit, comprising:
   an input end, for receiving an AC input signal;
   a rectifier, for converting the AC input signal into a rectified signal;
   an output end, electrically coupled to the rectifier, for outputting the rectified signal; and
   at least two voltage clamp circuits, each electrically coupled between the output end and a reference voltage end, for providing a direct-current (DC) electrical path between the output end and the reference voltage end when the rectified signal is greater than a threshold voltage of the voltage clamp circuit;
   wherein a threshold voltage of at least one of the voltage clamp circuit is different from a threshold voltage of another clamp circuit.

2. The power detection circuit of claim 1, wherein each of the at least two voltage clamp circuits provides an equivalent resistor on the DC electrical path, and an equivalent resistor of the at least one of the voltage clamp circuit is different from an equivalent resistor of the another clamp circuit.

3. The power detection circuit of claim 1, wherein the rectifier is a diode-connected first transistor, comprising:
   an emitter, electrically coupled to the output end, for outputting the rectified signal;
   a base, for receiving the AC input signal; and
   a collector, electrically coupled to the base.

4. The power detection circuit of claim 3, wherein the rectifier further comprises:
   an output capacitor, electrically coupled between the output end and the reference voltage end; and
   an output resistor, electrically coupled between the output end and the reference voltage end.

5. The power detection circuit of claim 1, wherein each of the at least two voltage clamp circuits comprises:
   a resistor module, comprising:
      a first end, electrically coupled to the output end;
      a second end; and
      at least one resistor, electrically coupled between the first end and the second end; and
   a diode module, comprising at least one diode, wherein an anode of the at least one diode is electrically coupled to the second end of the resistor module, and a cathode of the at least one diode is electrically coupled to the reference voltage end.

6. The power detection circuit of claim 1, wherein each of the at least two voltage clamp circuits comprises:
   a resistor module, comprising:
      a first end;
      a second end, electrically coupled to the reference voltage end; and
      at least one resistor, electrically coupled between the first end and the second end; and
   a diode module, comprising at least one diode, wherein an anode of the at least one diode is electrically coupled to the output end, and a cathode of the at least one diode is electrically coupled to the first end of the resistor module.

7. The power detection circuit of claim 2, wherein the equivalent resistor of the another clamp circuit is 2-10 times the equivalent resistor of the at least one clamp circuit.

8. A radio frequency circuit, comprising:
a baseband circuit, for generating a baseband signal according to a rectified signal;
a transceiver, electrically coupled to the baseband circuit, for converting the baseband signal into a radio frequency output signal;
an amplifier, electrically coupled to the transceiver, for amplifying the radio frequency output signal to generate an AC amplified radio frequency signal; and
a power detection circuit, comprising:
an input end, for receiving the AC amplified radio frequency signal;
a rectifier, for converting the AC amplified radio frequency signal into the rectified signal;
an output end, electrically coupled to the rectifier, for outputting the rectified signal; and
at least two voltage clamp circuits, each electrically coupled between the output end and a reference voltage end, for providing an electrical path between the output end and the reference voltage end when the rectified signal is greater than a threshold voltage of the voltage clamp circuit;
wherein a threshold voltage of at least one of the voltage clamp circuit is different from a threshold voltage of another clamp circuit.

9. The radio frequency circuit of claim 8, wherein each of the at least two voltage clamp circuits provides an equivalent resistor on the electrical path, and an equivalent resistor of the at least one of the voltage clamp circuit is different from an equivalent resistor of the another clamp circuit.

10. The radio frequency circuit of claim 8, wherein the rectifier is a diode-connected first transistor, comprising:
an emitter, electrically coupled to the output end, for outputting the rectified signal;
a base, for receiving the amplified radio frequency signal; and
a collector, electrically coupled to the base.

11. The radio frequency circuit of claim 8, wherein the rectifier further comprises:
an output capacitor, electrically coupled between the output end and the reference voltage end; and
an output resistor, electrically coupled between the output end and the reference voltage end.

12. The radio frequency circuit of claim 10, further comprising a switch module, comprising:
a second transistor, comprising:
a base, electrically coupled to a power switch end, for receiving a switch voltage;
a collector, electrically coupled to the collector of the first transistor, for receiving a power voltage; and
an emitter, electrically coupled to the base of the first transistor; and
a third transistor, comprising:
a collector, electrically coupled to the emitter of the second transistor;
a base, electrically coupled to the collector; and
an emitter, electrically coupled to the reference voltage end.

13. The radio frequency circuit of claim 12, wherein the switch module further comprises:
a first bias resistor, electrically coupled between the power switch end and the base of the second transistor;
a second bias resistor, electrically coupled between the emitter of the second transistor and the collector of the third transistor;
a third bias resistor, electrically coupled between the emitter of the third transistor and the reference voltage end;
a fourth bias resistor, electrically coupled between the collector of the third transistor and the base of the first transistor; and
a fifth bias resistor, electrically coupled between the collector of the first transistor and the collector of the second transistor.

14. The radio frequency circuit of claim 8, wherein each of the at least two voltage clamp circuits comprises:
a resistor module, comprising:
a first end, electrically coupled to the output end;
a second end; and
at least one resistor, electrically coupled between the first end and the second end; and
a diode module, comprising at least one diode, wherein an anode of the at least one diode is electrically coupled to the second end of the resistor module, and a cathode of the at least one diode is electrically coupled to the reference voltage end.

15. The radio frequency circuit of claim 8, wherein each of the at least two voltage clamp circuits comprises:
a resistor module, comprising:
a first end;
a second end, electrically coupled to the reference voltage end; and
at least one resistor, electrically coupled between the first end and the second end; and
a diode module, comprising at least one diode, wherein an anode of the at least one diode is electrically coupled to the output end, and a cathode of the at least one diode is electrically coupled to the first end of the resistor module.

16. The radio frequency circuit of claim 9, wherein the equivalent resistor of the another clamp circuit is 2-10 times the equivalent resistor of the at least one clamp circuit.

17. The radio frequency circuit of claim 8, further comprising a capacitor, electrically coupled between the input end and the rectifier.

* * * * *